United States Patent
Park et al.

(10) Patent No.: US 9,972,739 B2
(45) Date of Patent: May 15, 2018

(54) LIGHT DETECTION DEVICE

(71) Applicant: SEOUL VIOSYS CO., LTD., Ansan-si (KR)

(72) Inventors: Ki Yon Park, Ansan-si (KR); Hwa Mok Kim, Ansan-si (KR); Young Hwan Son, Ansan-si (KR); Daewoong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 35 days.

(21) Appl. No.: 14/825,581

(22) Filed: Aug. 13, 2015

(65) Prior Publication Data

US 2015/0349192 A1    Dec. 3, 2015

Related U.S. Application Data

(62) Division of application No. 14/140,933, filed on Dec. 26, 2013, now Pat. No. 9,166,092.

(30) Foreign Application Priority Data

Dec. 28, 2012    (KR) .................. 10-2012-0157326

(51) Int. Cl.
| | | |
|---|---|---|
| *H01L 21/00* | (2006.01) | |
| *H01L 31/18* | (2006.01) | |
| *H01L 31/108* | (2006.01) | |
| *H01L 31/0224* | (2006.01) | |
| *H01L 31/0352* | (2006.01) | |
| *H01L 31/0392* | (2006.01) | |

(52) U.S. Cl.
CPC .. *H01L 31/1828* (2013.01); *H01L 31/022483* (2013.01); *H01L 31/0392* (2013.01); *H01L 31/03529* (2013.01); *H01L 31/108* (2013.01); *H01L 31/1832* (2013.01); *Y02E 10/50* (2013.01); *Y02E 10/52* (2013.01)

(58) Field of Classification Search
CPC ....... H01L 31/022483; H01L 31/03529; H01L 31/0392; H01L 31/108; H01L 31/1828; H01L 31/1832; Y02E 10/52; Y02E 10/50
See application file for complete search history.

(56) References Cited

U.S. PATENT DOCUMENTS

| | | | |
|---|---|---|---|
| 2002/0155634 A1 | 10/2002 | D'Evelyn et al. | |
| 2010/0206362 A1 | 8/2010 | Flood | |
| 2011/0140152 A1* | 6/2011 | Song | H01L 33/44 |
| | | | 257/98 |

FOREIGN PATENT DOCUMENTS

| | | |
|---|---|---|
| JP | 2008283132 | 11/2008 |
| JP | 2012146705 | 8/2012 |

OTHER PUBLICATIONS

Non Final Office Action dated Jan. 22, 2015, in U.S. Appl. No. 14/140,933.
Notice of Allowance dated Jun. 22, 2015, in U.S. Appl. No. 14/140,933.

* cited by examiner

*Primary Examiner* — Meiya Li

(74) *Attorney, Agent, or Firm* — H.C. Park & Associates, PLC

(57) ABSTRACT

A method of forming a light detection device includes forming a non-porous layer on a substrate, forming a light absorption layer on the non-porous layer, the light absorption layer including pores formed in a surface thereof, forming a Schottky layer on the surface of the light absorption layer and in the pores thereof, and forming a first electrode layer on the Schottky layer.

6 Claims, 8 Drawing Sheets

LIGHT DETECTION DEVICE

CROSS-REFERENCE TO RELATED APPLICATION

This application is a divisional of U.S. patent application Ser. No. 14/140,933, filed on Dec. 26, 2013, which claims priority from and the benefit of Korean Patent Application No. 10-2012-0157326, filed on Dec. 28, 2012, which are hereby incorporated by reference for all purposes as if fully set forth herein.

BACKGROUND

Field

Exemplary embodiments of the present invention relate to a light detection device; and, particularly, to a light detection device having improved light detection efficiency by growing a single crystal porous zinc oxide (ZnO)-based oxide semiconductor layer on a substrate in accordance with an Metal-Organic Chemical Vapor Deposition (MOCVD) method.

Discussion of the Background

Ultraviolet light is invisible to the human eye because it falls outside the visible spectrum. Ultraviolet light is a generic term for electromagnetic radiation having a wavelength range of about 397 nm to 10 nm. Ultraviolet light having a very short wavelength may be indistinguishable from X-ray radiation. Furthermore, infrared light may be called heat rays, whereas ultraviolet light may be called actinic rays because they have a strong chemical action.

Ultraviolet light having a wavelength of 400 nm or less may be classified into several wavelength bands. An ultraviolet-A (UV-A) region light has a wavelength range of 320 nm to 400 nm, and 98% or more of UV-A region of solar light may reach the surface of the earth. The UV-A region light may affect a darkening or ageing phenomenon on human skin. An ultraviolet-B (UV-B) region light has a wavelength range of 280 nm to 320 nm, and only 2% of the UV-B region of solar light may reach the surface of the earth. The UV-B region light may have a very serious influence on the human body, such as contributing to skin cancer, cataracts, and a red spot phenomenon. A representative value of quantified influences of UV light on the human body is a UV index defined by the amount of incident UV-B region light.

Most of the UV-B region light may be absorbed by the ozone layer, but the amount of the UV-B region light that reaches the surface of the earth may increase, and an area reached by the UV-B region light may also increase, owing to the recent destruction of the ozone layer. This may raise a serious environmental problem.

An ultraviolet-C (UV-C) region light has a wavelength range of 200 nm to 280 nm, and the UV-C region rarely reaches the surface of the earth because almost the entire UV-C region of solar light may be absorbed in the atmosphere. The UV-C region light may be chiefly used in a sterilization action.

A device capable of detecting UV light includes a Photo Multiplier Tube (PMT) and a semiconductor device. The semiconductor device may be commonly used because it may be cheaper than the PMT and may also be smaller in size than the PMT.

The semiconductor device may be made of gallium nitride (GaN), silicon carbide (SiC), or zinc oxide (ZnO) having a wide bandgap. From among them, ZnO are materials may have a wide energy bandgap of 3.3 eV, high exciton binding energy of 60 meV in room temperature, and excellent optical characteristics. Furthermore, the energy bandgap of ZnO may be easily controlled by adding Mg or Cd.

In the prior art, in order to grow ZnO, a sputtering method or a Pulsed Laser Deposition (PLD) method capable of implementing high oxygen partial pressure may be chiefly used.

However, a ZnO layer grown using the conventional sputtering or PLD method may be problematic in that the binding force of crystals is low because sufficient thermal energy is not supplied when growing the ZnO layer and thus device characteristics may be deteriorated.

SUMMARY OF THE INVENTION

An exemplary embodiment of the present invention provide a light detection device having improved light detection efficiency by growing a single crystal porous ZnO-based oxide semiconductor layer on a substrate in accordance with an MOCVD method.

Additional features of the invention will be set forth in the description which follows, and in part will be apparent from the description, or may be learned by practice of the invention.

An embodiment of the present invention discloses a light detection device including a substrate, a non-porous layer formed over the substrate, a porous light absorption layer formed over the non-porous layer, a Schottky layer formed in part of a surface of the porous light absorption layer, and a first electrode layer formed in some region on the Schottky layer.

The substrate may be an insulating substrate, such as a sapphire substrate or a glass substrate.

The non-porous layer includes a ZnO layer, a $Zn_xCd_{1-x}O$ (0<x<1) layer, or a $Zn_yMg_{1-y}O$ (0<y<1) layer.

The porous light absorption layer includes a ZnO layer, a $Zn_xCd_{1-x}O$ (0<x<1) layer, or a $Zn_yMg_{1-y}O$ (0<y<1) layer.

The light detection device may further include a buffer layer between the substrate and the non-porous layer.

The buffer layer includes a ZnO layer, a ZnCdO layer, or a ZnMgO layer.

The buffer layer, the non-porous layer, and the porous light absorption layer are grown using an Organic Metal Chemical Vapor Deposition (MOCVD) method.

The Schottky layer is made of any one of Pt, Pd, ITO, Ti, and Ni.

The light detection device may further include a second electrode layer formed in some region on the porous light absorption layer. Part of the porous light absorption layer maybe etched, and a second electrode layer may be formed in some region on the non-porous layer.

The substrate may be a conductive substrate, such as a ZnO substrate, a Si substrate, a GaN substrate, a GaAs substrate, or a metal substrate. A second electrode layer is formed at the bottom of the substrate.

The buffer layer may have a thickness of greater than 0 to 0.1 µm or less.

The non-porous layer may have a thickness of greater than 0 to 5 µm or less.

The porous light absorption layer may have a thickness of 1 to 10 µm.

Each of pores formed in the porous light absorption layer may be greater than 0 to 5 µm or less in diameter and greater than 0 to 10 µm or less in depth.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
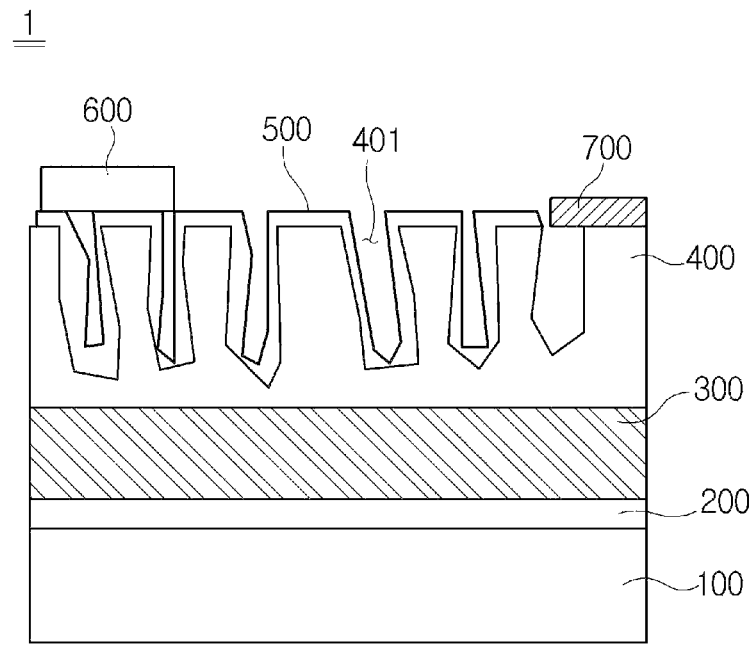
FIG. 1 is a cross-sectional view of a light detection device in accordance with an exemplary embodiment of the present invention.

Exemplary embodiments of the present invention will be described below in more detail with reference to the accompanying drawings. The present invention may, however, be embodied in different forms and should not be construed as limited to the exemplary embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and exemplary embodiments of the present invention.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Furthermore, the following exemplary embodiments are described in connection with the detection of UV, but it is to be noted that the present invention may also be applied to the detection of light having other wavelength regions.

Figure 2:
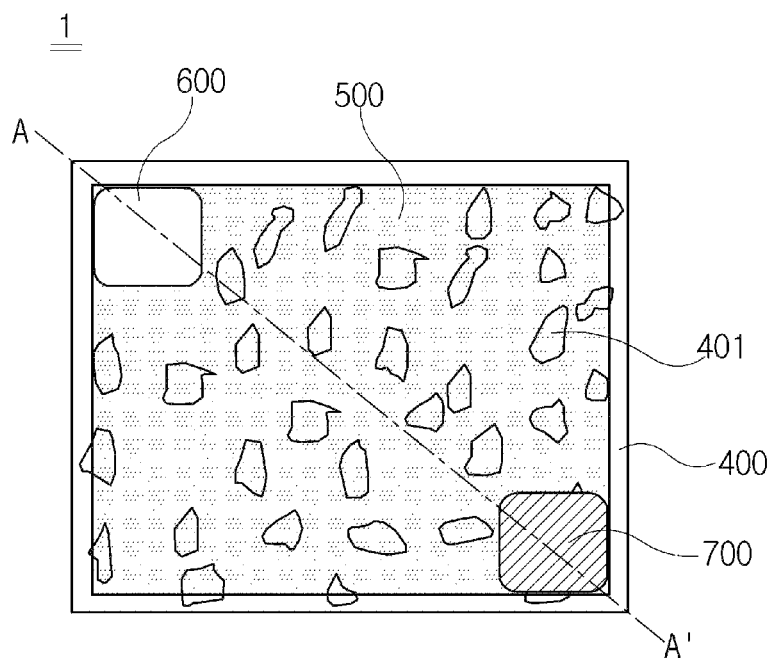
FIG. 2 is a plan view of the light detection device of FIG. 1.

FIG. 1 is a cross-sectional view of a light detection device 1 in accordance with an exemplary embodiment of the present invention, and FIG. 2 is a plan view of the light detection device of FIG. 1. In FIG. 2, line A-A' indicates the direction of a cross section shown in the cross-sectional view of FIG. 1.

The light detection device 1 in accordance with the present exemplary embodiment may include a buffer layer 200, a non-porous layer 300, and a porous light absorption layer 400 sequentially formed over a substrate 100 and a Schottky layer 500 formed on a portion of a surface of the porous light absorption layer 400. Furthermore, a first electrode layer 600 is formed on a portion of the Schottky layer 500, and a second electrode layer 700 is formed on a portion of the porous light absorption layer 400.

The substrate 100 may be a sapphire substrate, a gallium nitride (GaN) substrate, a silicon substrate, or a glass substrate. The buffer layer 200, the non-porous layer 300, and the porous light absorption layer 400 are respectively formed by growing a ZnO layer on the substrate 100 using an MOCVD method.

First, the substrate 100 is placed in the reaction chamber of an MOCVD apparatus, and pressure within the reaction chamber is maintained in a vacuum state of 100 Torr or less. Next, the buffer layer 200, that is, a ZnO layer, is grown on the substrate 100 by supplying a Zn source and O2 gas mixed at a proper ratio while heating the reaction chamber to a temperature in the range from 200° C. to 400° C. Here, Ar or N2 may be used as a carrier gas.

If the non-porous layer 300 is directly grown on the substrate 100, a crack may be generated due to a difference between the lattice constants of the substrate 100 and the non-porous layer 300, and it may be difficult to control the size of pores of the porous light absorption layer 400. In order to prevent this and/or other problems, the buffer layer 200 is grown prior to the growth of the non-porous layer 300.

The buffer layer 200 may be formed of the same ZnO material as the non-porous layer 300. In other embodiments, the buffer layer 200 may be formed of ZnCdO or ZnMgO.

The buffer layer 200 serves as a seed for growing the porous light absorption layer 400. Accordingly, the buffer layer 200 may have a thickness of 100 Å to 500 Å.

After growing the buffer layer 200, the non-porous layer 300, that is, a single crystal ZnO layer, and the porous light absorption layer 400, are grown by raising temperature within the reaction chamber to a temperature from 600° C. to 800° C. The non-porous layer 300 and the porous light absorption layer 400 may be grown to a thickness of 1 μm to 10 μm. If the temperature within the reaction chamber exceeds 800° C., a ZnO layer may not be grown due to thermal energy of the substrate 100, with the result that the ZnO layer may be evaporated and exhausted from the reaction chamber.

Furthermore, while the temperature is raised in order to grow the non-porous layer 300 and the porous light absorption layer 400, the Zn source is stopped and only $O_2$ gas is injected into the reaction chamber. Thus, evaporation of oxygen from the ZnO non-porous layer 300 can be supplemented.

Furthermore, if pressure within the reaction chamber is 100 Torr or less and a ratio of $O_2$/Zn is 5,000 or more, the area of each pore 401 of the porous light absorption layer 400 tends to be reduced. If pressure within the reaction chamber is 100 Torr or more and a ratio of $O_2$/Zn is 1,000 or less, the area of each pore 401 tends to be increased. Furthermore, if pressure within the reaction chamber is 300 Torr or more, and a ratio of $O_2$/Zn is 1,000 or less, under the same temperature condition, the porous light absorption layer 400 is grown in a nano pole shape.

Accordingly, each pore 401 of the porous light absorption layer 400 can be formed according to a desired standard by properly controlling pressure and temperature within the reaction chamber and a ratio of O2/Zn. Here, in order to improve light absorption efficiency, each pore 401 may be formed to have a diameter of greater than 0 to 3 μm and a depth of 0.1 to 10 μm.

The depth of the pore 401 can be controlled by changing a growth process condition to 2-step growth process. That is, if pores are not formed in a first process after growing the buffer layer 200, or in order to make pores formed in the first process have a diameter of 0.1 μm or less, the single crystal non-porous layer 300, that is, an initial growth layer, is formed to a thickness of greater than 0 to 5 μm.

Thereafter, pores are grown in a second process. In the second process, the porous light absorption layer 400 including pores having a desired diameter and depth can be formed by properly controlling pressure and a ratio of $O_2$/Zn (i.e., a flow ratio), as described above. Meanwhile, the non-porous layer 300 may be grown using a ZnO layer, or may be made of the same materials as the porous light absorption layer 400.

The Schottky layer 500 is formed by depositing a metal or alloy, such as Pt, Pd, indium tin oxide (ITO), Ti, or Ni, on a surface of the porous light absorption layer 400.

As shown in FIG. 1, deposited metal is introduced into the pores 401, thereby forming the Schottky layer 500 on an upper surface of the porous light absorption layer 400 and in the pores 401. As shown in FIG. 2, the Schottky layer 500 is formed on a first portion of the porous light absorption layer 400, and the second electrode layer 700 is formed on a second portion of the porous light absorption layer 400, so that the second electrode layer 700 comes in ohmic-contact with the porous light absorption layer 400.

The first electrode layer 600 is deposited on a portion of the Schottky layer 500, and the second electrode layer 700 is deposited on a portion of the porous light absorption layer 400.

In the first electrode layer 600, conductive metal, such as Ni/Au, comes in ohmic-contact with the Schottky layer 500 to a thickness of 200 nm to 1 μm. A region of the Schottky layer 500 in which the first electrode layer 600 is formed does not transmit light therethrough, and thus, a light reaction region is reduced because the region of the Schottky layer 500 does not serve as a light absorption layer. For this reason, the first electrode layer 600 may be formed to have a minimum area necessary for wire bonding.

Furthermore, in the second electrode layer 700, metal, such as Ti/Al or Cr/Ni/Au, comes in ohmic-contact with the porous light absorption layer 400 to a thickness of 400 nm to 5 μm. Ti, Cr, Ni are contact electrode and the sum of the thicknesses of Ti, Cr, and/or Ni are less than 500 nm, and the rest of the thickness consists of Au. Accordingly, the Schottky layer 500 is formed in regions of the porous light absorption layer 400 other than a region of the porous light absorption layer 400 such that the second electrode layer 700 is spaced apart from the Schottky layer 500 and comes in ohmic-contact with the porous light absorption layer 400. Here, the second electrode layer 700 may be formed after etching part of the porous light absorption layer 400.

In accordance with the light detection device 1 constructed as described above, UV light passes through the Schottky layer 500, and the UV light is absorbed by the porous light absorption layer 400. In this case, since a surface area of the porous light absorption layer 400 is increased by the plurality of pores 401, light detection efficiency may be improved because the amount of absorbed UV light is increased.

Meanwhile, UV light absorbed by the porous light absorption layer 400 generates electrons and holes within the porous light absorption layer 400. The generated holes move to the first electrode layer 600 through the Schottky layer 500, and the generated electrons move to the second electrode layer 700, that is, an ohmic contact layer. Accordingly, the amount of incident UV light can be measured by sensing a flowing current.

Figure 3:
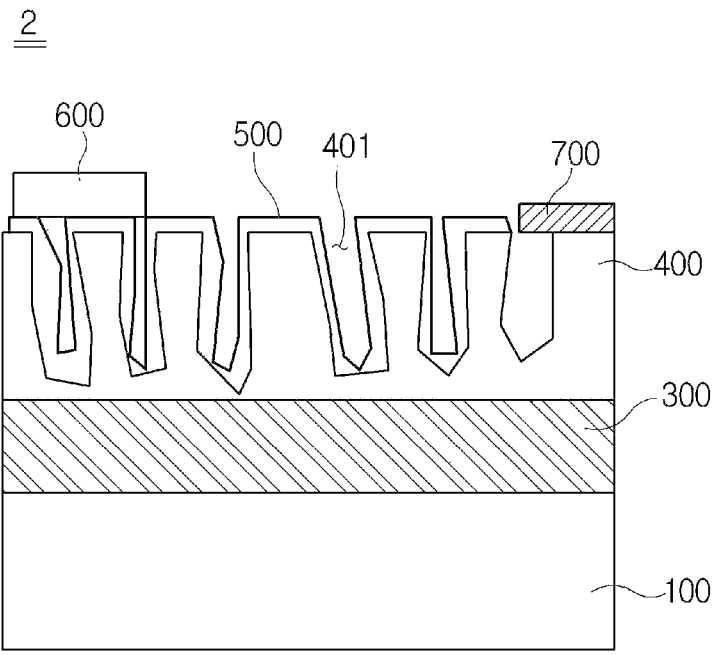
FIG. 3 is a cross-sectional view of a light detection device in accordance with an exemplary embodiment of the present invention.

FIG. 3 is a cross-sectional view of a light detection 2 device in accordance with an exemplary embodiment of the present invention.

The light detection device 2 has almost the same construction as that of the first embodiment except that the non-porous layer 300 is grown directly on the substrate 100 without an additional buffer layer 200 (refer to FIG. 1). Accordingly, the same elements as those of the exemplary embodiment described with reference to FIGS. 1 and 2 are assigned the same reference numerals, and a redundant description is omitted.

As shown in FIG. 3, the non-porous layer 300 can be grown on the substrate 100 without forming an additional buffer layer because ZnO single crystals can be grown easily on a heterogeneous substrate. If the substrate 100 and the non-porous layer 300 have significantly different characteristics, however, polycrystalline growth may be obtained. In this case, attention needs to be paid to the deterioration of the crystal characteristics of the porous light absorption layer 400. That is, in case that the characteristics of substrate 100 and non-porous layer 300 are significantly different, it comes in polycrystalline growth, and polycrystalline growth may result in deterioration of crystal characteristics of porous light absorption layer 400. Therefore, it may be better to form an additional buffer layer if the characteristics substrate 100 and non-porous layer 300 are significantly different.

Figure 4:
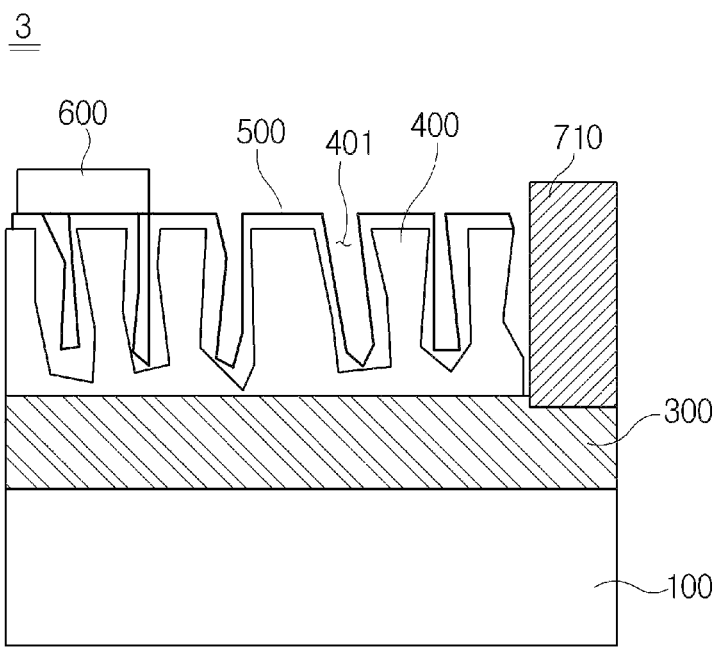
FIG. 4 is a cross-sectional view of a light detection device in accordance with an exemplary embodiment of the present invention.
Figure 5:
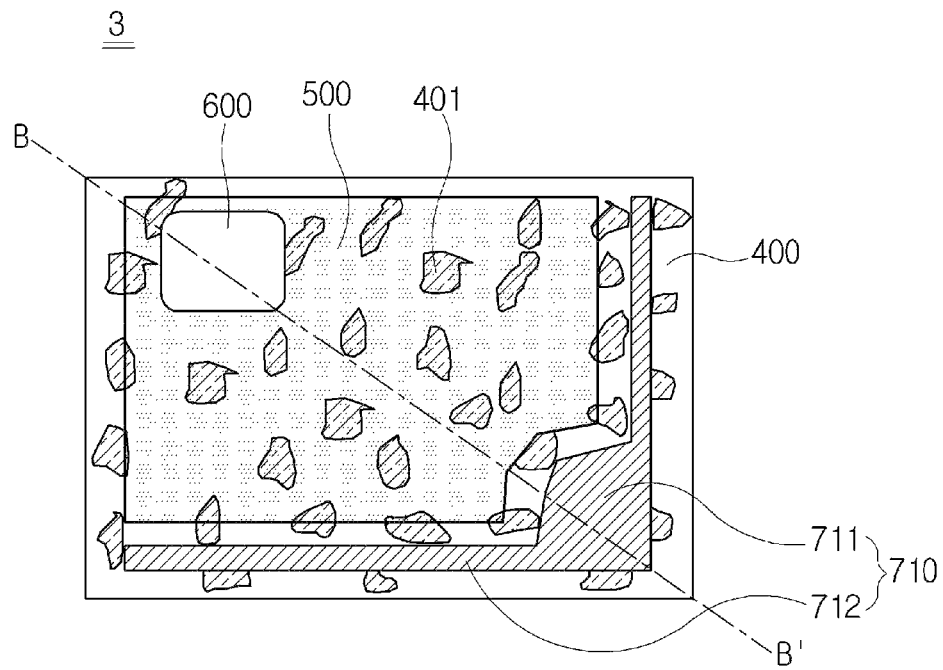
FIG. 5 is a plan view of the light detection device of FIG. 4.

FIG. 4 is a cross-sectional view of a light detection device 3 in accordance with an exemplary embodiment of the present invention, and FIG. 5 is a plan view of the light detection device 3 of FIG. 4. In FIG. 5, line B-B' indicates the direction of a cross section shown in the cross-sectional view of FIG. 4.

The light detection device 3 has almost the same construction as that of the exemplary embodiment described with reference to FIG. 3 except a shape of the second electrode layer 710 and a place where the second electrode layer 710 is formed.

In accordance with the light detection device 3, part of the porous light absorption layer 400 is etched, thereby exposing part of the non-porous layer 300, and a second electrode layer 710 is formed on the exposed part of the non-porous layer 300. Here, only the porous light absorption layer 400 may be etched or part of the non-porous layer 300 along with the porous light absorption layer 400 may be etched.

The second electrode layer 710 may include a body unit 711 configured to face the first electrode layer 600 in a diagonal direction and a pair of wing parts 712 extended from the body unit 711 to both sides of the porous light absorption layer 400 along the outer edges thereof. The second electrode layer 710 may have a top surface higher than the height of the porous light absorption layer 400 and lower than the top surface of the first electrode layer 600.

If part of the porous light absorption layer 400 is etched and the second electrode layer 710 is formed on the exposed part of the non-porous layer 300 as described above, the flow of current may become smooth because the contact area of the second electrode layer 710 is increased.

Furthermore, there is an advantage in that a peeling phenomenon at wire bonding is prevented because the second electrode layer 710 is formed of the body unit 711 and the pair of wing parts 712.

Figure 6:
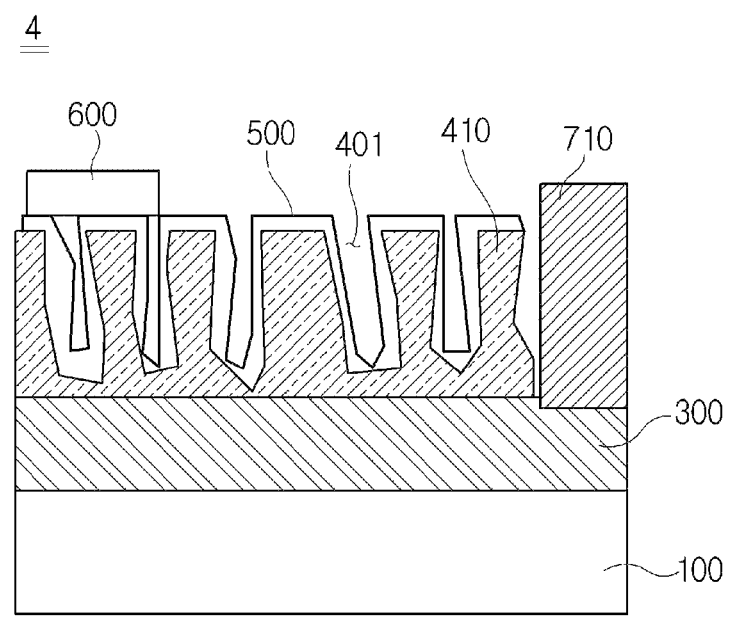
FIG. 6 is a cross-sectional view of a light detection device in accordance with an exemplary embodiment of the present invention.

FIG. 6 is a cross-sectional view of a light detection device 4 in accordance with an exemplary embodiment of the present invention.

The light detection device 4 has almost the same construction as that of the exemplary embodiment described with reference to FIGS. 4 and 5 except that $Zn_xCd_{1-x}O$ (0<x<1) is used as a porous light absorption layer 410.

If a $Zn_xCd_{1-x}O$ (0<x<1) layer is used as the porous light absorption layer 410, a wavelength longer than a wavelength detected by a ZnO layer can be detected.

Light having a longer wavelength region can be detected according to an increase in the composition of cadmium (Cd). For example, assuming that light having a wavelength of 380 nm can be detected using a ZnO layer, a light detection device capable of detecting a wavelength longer than the wavelength of 380 nm can be formed using a ZnCdO layer.

Figure 7:
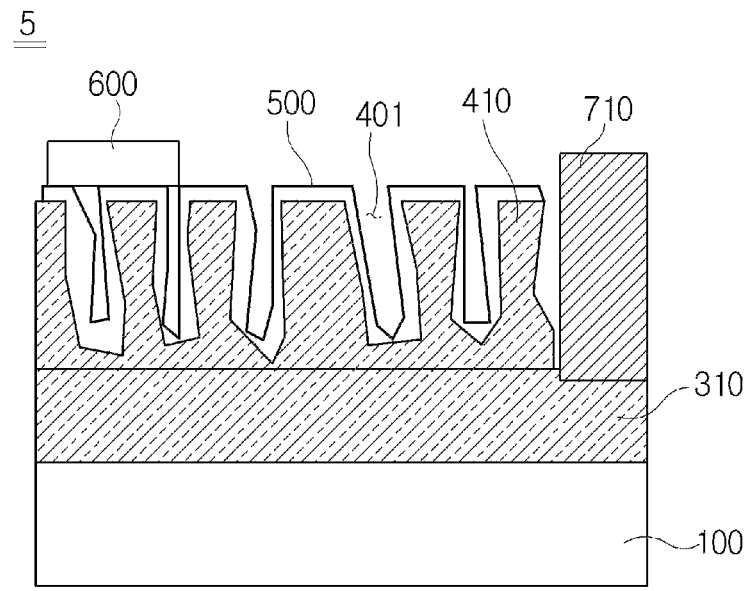
FIG. 7 is a cross-sectional view of a light detection device in accordance with an exemplary embodiment of the present invention.

FIG. 7 is a cross-sectional view of a light detection device 5 in accordance with an exemplary embodiment of the present invention.

The light detection device 5 has almost the same construction as that of the exemplary embodiment shown in FIG. 6 except that both a non-porous layer 310 and the porous light absorption layer 410 are made of a $Zn_xCd_{1-x}O$ (0<x<1) layer.

Figure 8:
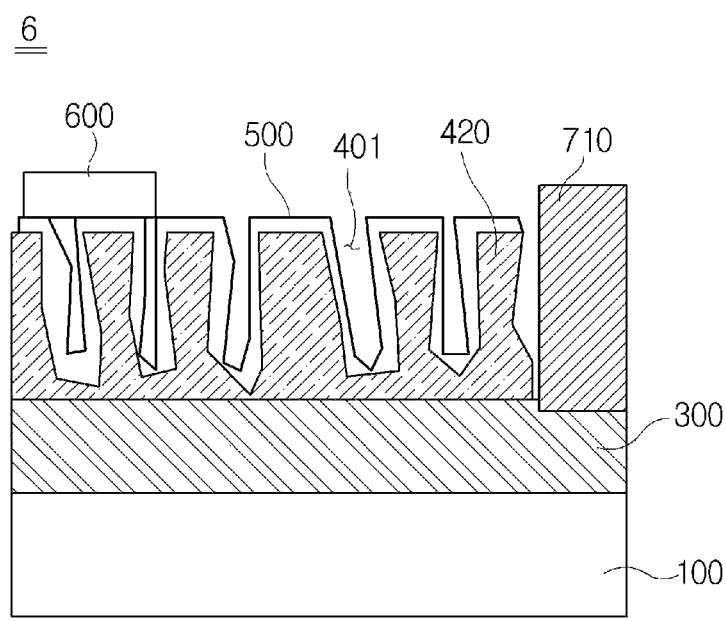
FIG. 8 is a cross-sectional view of a light detection device in accordance with an exemplary embodiment of the present invention.

FIG. 8 is a cross-sectional view of a light detection device in accordance with an exemplary embodiment of the present invention.

The light detection device 6 has almost the same construction as that of the exemplary embodiment described with reference to FIG. 4 except that $Zn_yMg_{1-y}O$ (0<y<1) is used as a porous light absorption layer 420.

If a $Zn_yMg_{1-y}O$ (0<y<1) layer is used as the porous light absorption layer 420, a wavelength shorter than a wavelength detected using a ZnO layer can be detected.

Light having a shorter wavelength region can be detected according to an increase in the composition of magnesium (Mg). For example, assuming that light having a wavelength of 380 nm can be detected using a ZnO layer, a light detection device capable of detecting a wavelength shorter than the wavelength of 380 nm can be formed using a ZnMgO layer.

Figure 9:
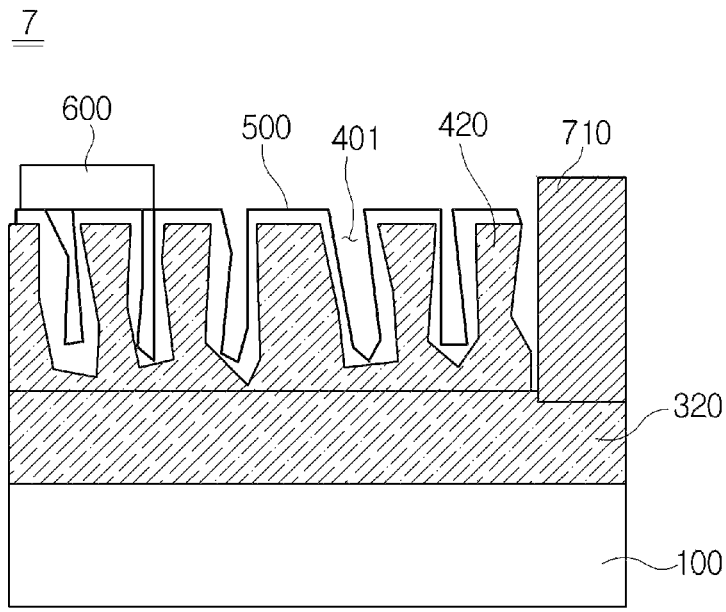
FIG. 9 is a cross-sectional view of a light detection device in accordance with an exemplary embodiment of the present invention.

FIG. 9 is a cross-sectional view of a light detection device 7 in accordance with an exemplary embodiment of the present invention.

The light detection device 7 has almost the same construction as that of the exemplary embodiment shown in FIG. 8 except that both a non-porous layer 320 and the porous light absorption layer 420 are formed of a $Zn_yMg_{1-y}O$ (0<y<1) layer.

Figure 10:
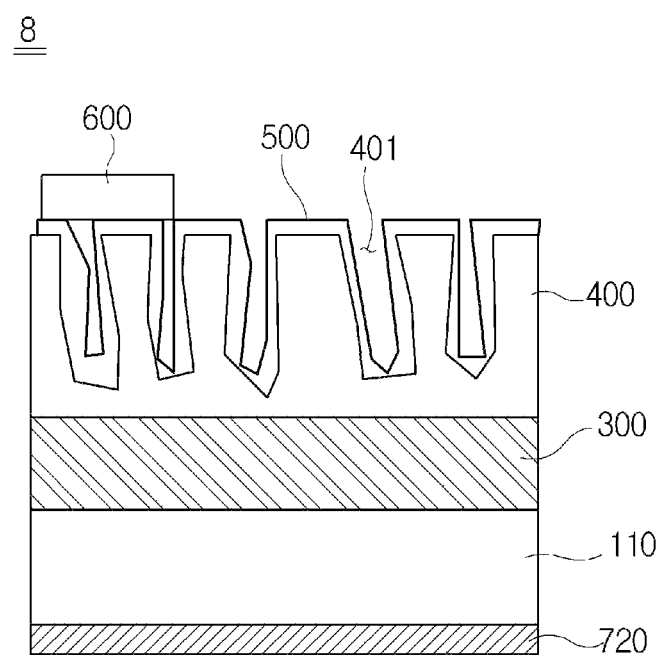
FIG. 10 is a cross-sectional view of a light detection device in accordance with an exemplary embodiment of the present invention.
Figure 11:
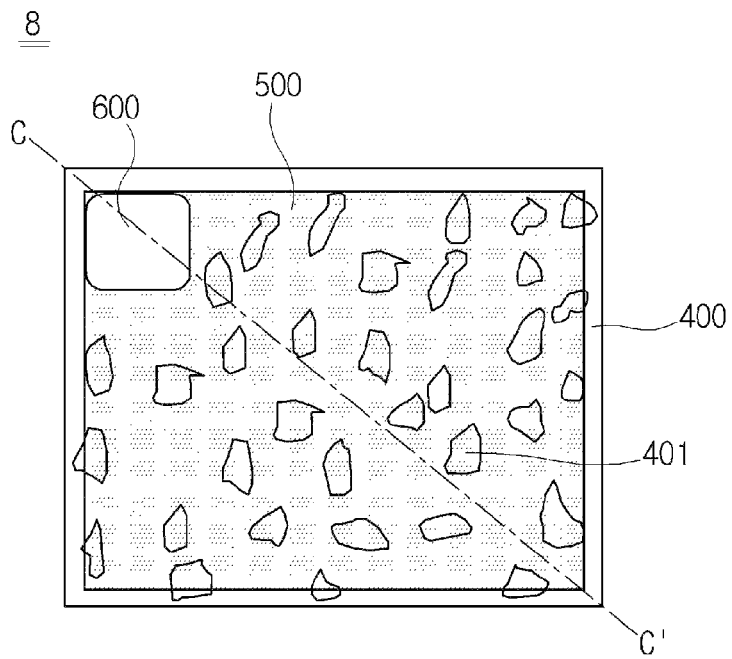
FIG. 11 is a plan view of the light detection device of FIG. 10.

FIG. 10 is a cross-sectional view of a light detection device 8 in accordance with an exemplary embodiment of the present invention, and FIG. 11 is a plan view of the light detection device 8 of FIG. 10. In FIG. 11, line C-C' indicates the direction of a cross section in the cross-sectional view of FIG. 10.

The light detection device 8 has almost the same construction as that of the exemplary embodiment described with reference to FIG. 3 except that a conductive substrate 110 is used instead of the insulating substrate 100 (refer to FIG. 3) and a second electrode layer 720 is formed at the bottom of the conductive substrate 110.

The light detection device 8 includes the conductive substrate 110 made of, for example, ZnO, Si, GaN, SiC, or GaAs.

Furthermore, the second electrode layer 720 can be formed at the bottom of the substrate 110. The second electrode layer 720 is formed at the bottom of the substrate 110 and the area of the Schottky layer 500, that is, a light-receiving area, may be increased as compared with the exemplary embodiment shown in FIG. 3. Thus, light-receiving efficiency of the light detection device in the same area may be increased and the light detection device can stably operate.

Figure 12:
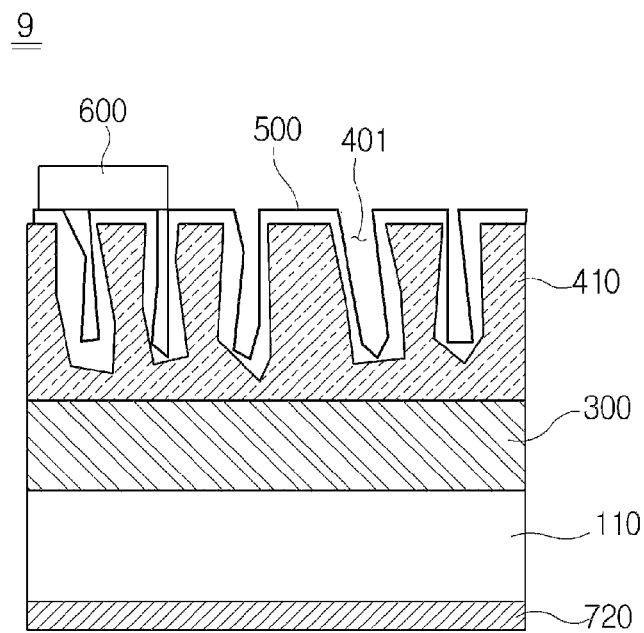
FIG. 12 is a cross-sectional view of a light detection device in accordance with an exemplary embodiment of the present invention.

FIG. 12 is a cross-sectional view of a light detection device 9 in accordance with an exemplary embodiment of the present invention.

The light detection device 9 in has almost the same construction as that of the exemplary embodiment shown in FIGS. 10 and 11 except that light having a wavelength region longer than a wavelength region that is detected by the light detection device 8 of the exemplary embodiment of FIGS. 10 and 11 can be detected because $Zn_xCd_{1-x}O$ (0<x<1) is used as a porous light absorption layer 410.

Figure 13:
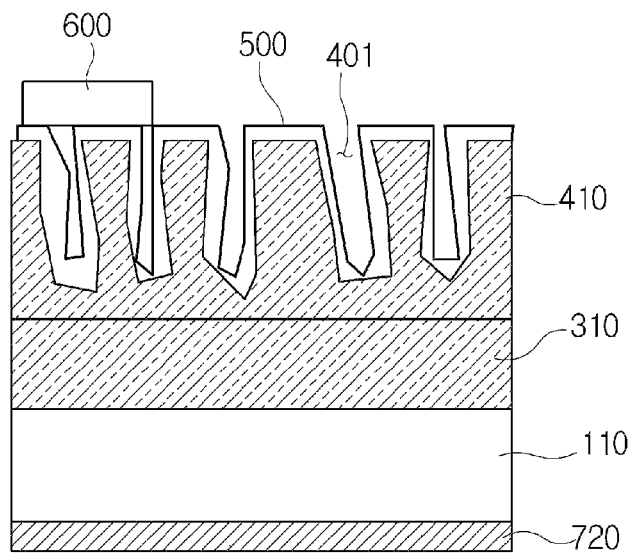
FIG. 13 is a cross-sectional view of a light detection device in accordance with an exemplary embodiment of the present invention.

FIG. 13 is a cross-sectional view of a light detection device in accordance with an exemplary embodiment of the present invention.

The light detection device 10 has almost the same construction as that of the exemplary embodiment shown in FIG. 12 except that both a non-porous layer 310 and the porous light absorption layer 410 are formed of a $Zn_xCd_{1-x}O$ (0<x<1) layer.

Figure 14:
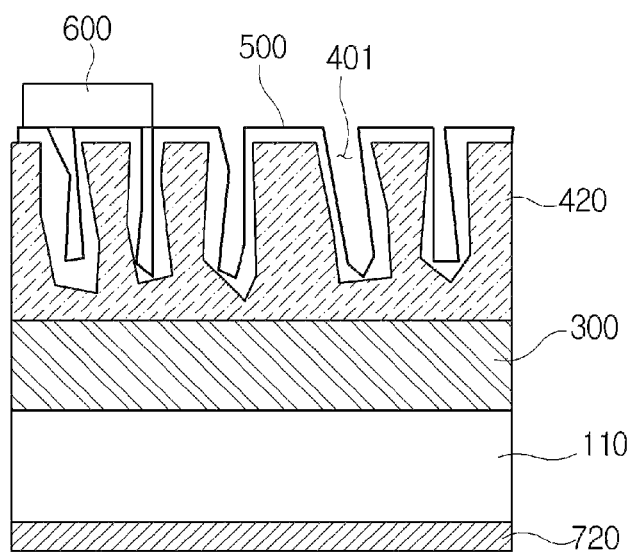
FIG. 14 is a cross-sectional view of a light detection device in accordance with an exemplary embodiment of the present invention.

FIG. 14 is a cross-sectional view of a light detection device 11 in accordance with an eleventh embodiment of the present invention.

The light detection device 11 in accordance with the eleventh embodiment of the present invention has almost the same construction as that of the exemplary embodiment described with reference to FIG. 10 except that light having a wavelength region shorter than a wavelength region that is detected by the light detection device 10 can be detected because $Zn_yMg_{1-y}O$ (0<y<1) is used as a porous light absorption layer 420.

Figure 15:
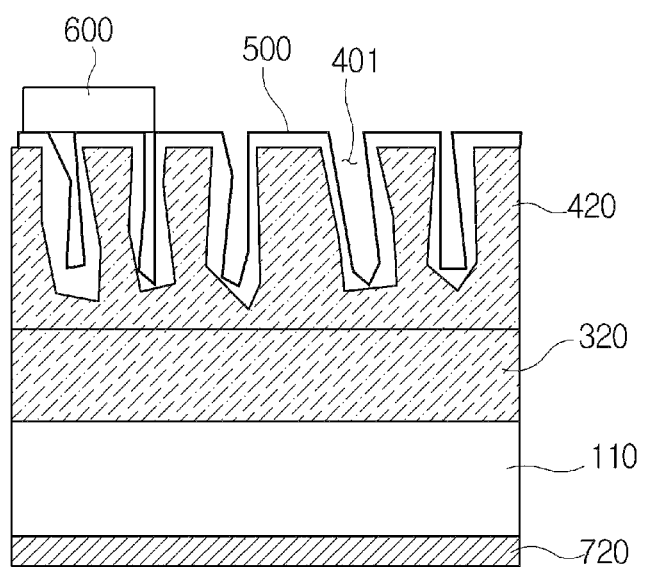
FIG. 15 is a cross-sectional view of a light detection device in accordance with an exemplary embodiment of the present invention.

FIG. 15 is a cross-sectional view of a light detection device in accordance with an exemplary embodiment of the present invention.

The light detection device 12 has almost the same construction as that of the exemplary embodiment shown in FIG. 14 except that both a non-porous layer 320 and the porous light absorption layer 420 are formed of a $Zn_yMg_{1-y}O$ (0<y<1) layer.

In accordance with the light detection devices according to the exemplary embodiments of the present invention, the single crystal porous ZnO-based oxide semiconductor layer is grown on the substrate in accordance with an MOCVD method.

Furthermore, the area of the Schottky layer formed on the porous layer is maximized. Accordingly, light detection efficiency of the light detection device may be improved due to the maximization of a light-receiving area.

Furthermore, the light detection devices according to exemplary embodiments of the present invention have versatile applications because a desired wavelength region can be detected by properly selecting the Cd or Mg content of the porous layer, that is, a light absorption layer.

While the present invention has been described with respect to the exemplary embodiments, it will be apparent to those skilled in the art that various changes and modifications may be made without departing from the spirit and scope of the invention as defined in the following claims.

What is claimed is:

1. A method of forming a light detection device, the method comprising:
   forming a non-porous layer on a substrate;
   forming a light absorption layer of the light detection device on the non-porous layer, the light absorption layer being configured to absorb light and comprising pores formed in a surface of the light absorption layer;
   forming a Schottky layer on the surface of the light absorption layer and in the pores of the light absorption layer; and
   forming a first electrode layer on the Schottky layer.

2. The method of claim 1, wherein the non-porous layer comprises ZnO, $Zn_xCd_{1-x}O$ (0<x<1), or $Zn_yMg_{1-y}O$ (0<y<1), and
   wherein the light absorption layer comprises ZnO, $Zn_xCd_{1-x}O$ (0<x<1), or $Zn_yMg_{1-y}O$ (0<y<1).

3. The method of claim 2, wherein the non-porous layer and the light absorption layer are formed using Metal-Organic Chemical Vapor Deposition (MOCVD), and
   wherein the non-porous layer and the light absorption layer are formed at a temperature in a range from 600° C. to 800° C., and a pressure is in a range of 100 Torr to 300 Torr.

4. The method of claim 3, wherein each pore is formed to have a diameter of greater than 0 μm to 3 μm and a depth of 0.1 μm to 10 μm.

5. The method of claim 4, wherein $O_2$ and Zn source gasses are used to form the light absorption layer, and the ratio of $O_2$/Zn is in a range of 1,000 to 5,000.

6. The method of claim 5, wherein the non-porous layer is first formed to a thickness in a range of greater than 0 μm to 5 μm, and
   wherein the light absorption layer is formed after forming the non-porous layer.

* * * * *